(12) United States Patent
Okubo (10) Patent No.: US 8,923,075 B2
(45) Date of Patent: Dec. 30, 2014

(54) MEMORY CONTROL DEVICE

(71) Applicant: Renesas Electronics Corporation, Kawasaki-shi, Kanagawa (JP)

(72) Inventor: Junya Okubo, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 250 days.

(21) Appl. No.: 13/657,281

(22) Filed: Oct. 22, 2012

(65) Prior Publication Data
US 2013/0141990 A1 Jun. 6, 2013

(30) Foreign Application Priority Data
Nov. 1, 2011 (JP) ................... 2011-240557

(51) Int. Cl.
*G11C 7/00* (2006.01)
*G11C 7/10* (2006.01)

(52) U.S. Cl.
CPC ............ *G11C 7/1057* (2013.01); *G11C 7/1009* (2013.01)
USPC ............ 365/189.05; 365/189.12; 365/233.18; 365/238.5

(58) Field of Classification Search
USPC ................ 365/189.05, 189.12, 233.18, 238.5
See application file for complete search history.

(56) References Cited

U.S. PATENT DOCUMENTS

| 5,822,254 | A | | 10/1998 | Koshikawa et al. |
| 6,072,749 | A | * | 6/2000 | Nakamura et al. ......... 365/238.5 |
| 6,643,214 | B2 | * | 11/2003 | Taito et al. ............... 365/230.06 |
| 6,711,701 | B1 | * | 3/2004 | Roohparvar et al. ........... 714/24 |

FOREIGN PATENT DOCUMENTS

JP  11-134859 A  5/1999

* cited by examiner

*Primary Examiner* — Son Dinh
(74) *Attorney, Agent, or Firm* — Foley & Lardner LLP (57) ABSTRACT

A memory control device that can reduce a power consumption at the time of writing a memory. The memory control device includes a data output buffer circuit that burst-transfers data to a memory device through a data bus, and a mask signal output buffer circuit that outputs, to the memory device, a mask signal indicative of data that prohibits write into a memory cell within the memory device among the data. The data output buffer circuit puts an output node into a high impedance state when the mask signal is indicative of write prohibition.

15 Claims, 11 Drawing Sheets

MEMORY CONTROL DEVICE

CROSS-REFERENCE TO RELATED APPLICATIONS

The disclosure of Japanese Patent Application No. 2011-240557 filed on Nov. 1, 2011 including the specification, drawings and abstract is incorporated herein by reference in its entirety.

BACKGROUND

The present invention relates to a memory control device that controls a semiconductor memory, and more particularly to a memory control device that controls an SDRAM.

Most of SDRAMs (Synchronous Dynamic Random Access Memories) read and write data with respect to the memory control device through a bus. Read data is transferred from the SDRAM to the memory control device through a data bus, and write data is transferred from the memory control device to the SDRAM through the data bus. Accordingly, the data bus is bidirectional, and the SDRAM and the memory control device, which are connected to both sides of the data bus, are required to put an output buffer connected to the data bus into a high impedance state except for a case of outputting the data so as not to affect data output by another device.

On the other hand, in the recent SDRAMs, a transfer rate is improved, and the standards that establish the transfer methods of data are evolved to DDR (double data rate), DDR2, and DD3. With an increase in the transfer rate, a signal quality is liable to be degraded, and ways to keep a necessary signal quality have been taken. One of the ways is a termination of a signal line. The signal line is terminated by a termination circuit, to thereby reduce a reflection of the signal and enable the signal quality to be maintained. The termination circuits applied in the SDRAM such as DDR, DDR2, and DDR3 are a circuit of the type that fixes a voltage of no signal to about ½ of a supply voltage through a resistor, or a circuit equivalent to that type.

In order to realize the high speed, the memory has a prefetch function of accessing to plural pieces of data within a memory cell in parallel in a lump, and the data is serialized and transferred at once. This transfer is called "burst transfer". For example, in the DDR3, basically 8 pieces of data is sequentially transferred. When the burst transfer is conducted, data for a plurality of addresses is transferred. If data is to be written at only parts of those addressed, the function of a data mask is used. The SDRAM has a mask signal of one bit, for example, every data signal of parallel data 8 bits, and operates so as not to write data at a corresponding address when the mask signal is H level.

For example, write of data into the SDRAM is conducted by the aid of a data signal DQ, a strobe signal DQS (DQSB), and a mask signal DM, as illustrated in FIGS. 1A to 1C. Write data D0 to D7 are output to the data signal DQ, and take-in timing of the write data D0 to D7 is indicated by the strobe signal DQS. The strobe signal DQSB is a signal obtained by inverting a logic of the strobe signal DQS. The data is taken in timing indicated by the respective rising edges whereby the data can be transferred at a speed twice as high as the speed indicated by a clock signal.

When write is to be masked, the mask signal DM is set to the H level whereby the SDRAM can prevent the taken data from being written into the memory. The mask signal DM illustrated in FIGS. 1A to 1C is high level when the data signal DQ indicates data D1, D5, and D6. The data D0, D2 to D4, and D7 are written into the memory, but the data D1, D5, and D6 are not written into the memory. Thus, with the provision of the mask signal DM, the data of the continuous addresses with the inclusion of the data that does not need to be written can be dealt with.

Japanese Unexamined Patent Application Publication No. Hei 11 (1999)-134859 discloses a technique in which, in a synchronous semiconductor memory, a data output of an output terminal and impedance increasing timing are easily optimized. The semiconductor memory includes a data amplifier, a first latch circuit, an output control circuit, second and third latch circuits, a first output transistor, and a second output transistor. The data amplifier supplies a complementary read data read from a memory cell. The first latch circuit latches a mask signal in response to a timing signal. The output control circuit receives the mask signal latched by the first latch circuit and the complementary read data supplied from the data amplifier. The output control circuit generates first and second conduction control signals complementary to each other on the basis of the complementary read data if the mask signal is one logic level, and generates the first and second conduction control signals each having the same level regardless of the complementary read data if the mask signal is the other logic level. The second and third latch circuits latch the first and second conduction control signals in response to the timing signal, respectively. The first output transistor is connected between a first supply terminal and an output terminal, and a conduction state of the first output transistor is controlled on the basis of the first conduction control signal latched by the second latch circuit. The second output transistor is connected between a second supply terminal and the output terminal, and a conduction state of the second output transistor is controlled on the basis of the second conduction control signal latched by the third latch circuit.

SUMMARY

An object of the present invention is to provide a memory control device that can reduce a power consumption during a memory write operation.

Hereinafter, means for solving the problems will be described with reference to numeral numbers and symbols used in "DETAILED DESCRIPTION". Those numeral numbers and symbols are added for the purpose of clarifying correspondence relationships between the description of "WHAT IS CLAIMED IS:" and "DETAILED DESCRIPTION". However, those numeral numbers and symbols should not be used for interpretation of the technical scope of the present invention described in "WHAT IS CLAIMED IS:".

According to one aspect of the present invention, there is provided a memory control device (10) including: a data output buffer circuit (390) that burst-transfers data to a memory device (20) through a data bus; and a mask signal output buffer circuit (190) that outputs, to the memory device, a mask signal indicative of data that prohibits write into a memory cell within the memory device among the data, in which the data output buffer circuit (390) puts the output node into a high impedance state when the mask signal indicates write prohibition.

According to another aspect of the present invention, there is provided a memory control device including: a data signal generator circuit (300); a buffer circuit (390); a mask signal generator circuit (100); and an output control signal generation unit (200/210/220). The data signal generator circuit (300) generates data (DTO) to be burst-transferred to the memory device (20). The buffer circuit (390) burst-transfers the data to the memory device (20) through a data bus. The mask signal generator circuit (100) generates a mask signal (DM) indicative of whether the data on the data bus is written into a memory cell within the memory device (20), or not, on the basis of a mask control signal (MOA/MOB) indicative of whether data write is enabled, or not. The output control signal generation unit (200/210/220) generates an output control signal (OE) that puts an output node of the buffer circuit (390) into a high impedance state when there is no data to be output to the data bus, on the basis of a data control signal (TRIA/TRIB) indicative of whether there is data, or not. The output control signal generation unit (200/210/220) changes the output control signal (OE) during a period in which the data is burst-transferred to put the output node into a high impedance state, on the basis of the mask control signal (MOA/MOB).

Also, according to still another aspect of the present invention, there are provided a semiconductor integrated circuit has the above memory control device, and a memory system including a semiconductor integrated circuit having the memory control device, and a memory device having a termination circuit that terminates a data bus transferring data output from the semiconductor integrated circuit.

According to the present invention, there can be provided the memory control device that reduces the power consumption during memory writing.

BRIEF DESCRIPTION OF THE DRAWINGS

FIGS. 8A to 8N are timing charts illustrating the operation of the output control signal generation unit according to the second embodiment;

FIGS. 10A to 10N are timing charts illustrating the operation of the output control signal generation unit according to the third embodiment.

DETAILED DESCRIPTION

Embodiments of the present invention will be described with reference to the accompanying drawings.

Figure 2:
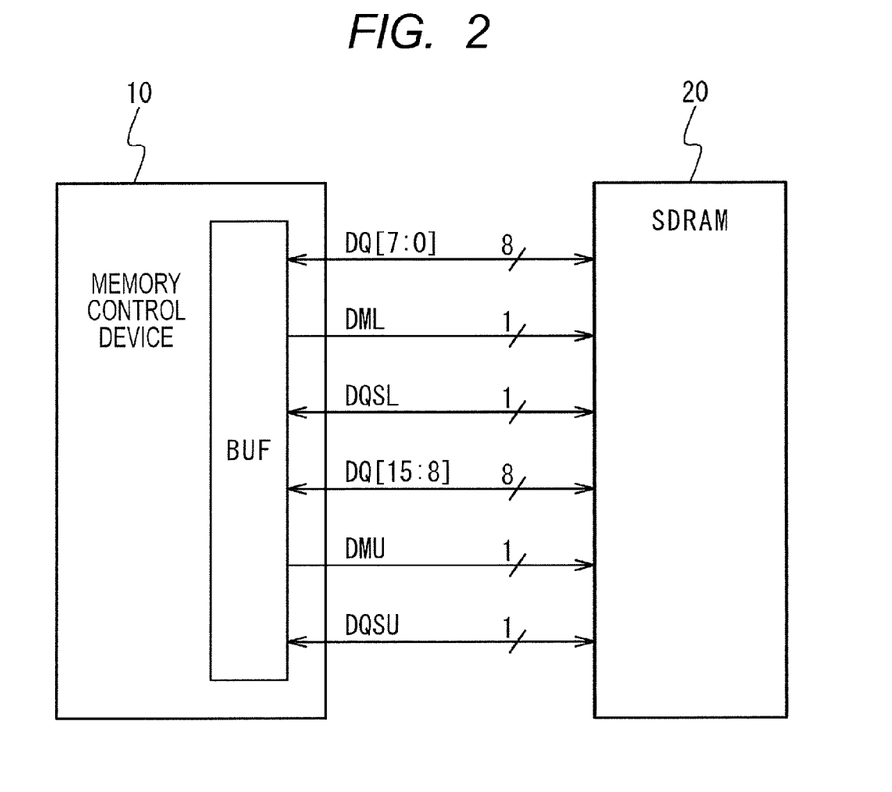
FIG. 2 is a diagram illustrating a configuration of a memory system according to an embodiment of the present invention.

FIG. 2 is a diagram illustrating a configuration of a memory system according to an embodiment of the present invention. The memory system includes an SDRAM 20 that operates in synchronism with a clock signal, and a memory control device 10 that controls the operation of the SDRAM 20. A bus width is 16 bits, and data of low 8 bits is transferred by a data signal DQ [7:0], a mask signal DML, and a strobe signal DQSL. Data of high 8 bits is transferred by a data signal [15:8], a mask signal DMU, and a strobe signal DQSU. The data signal DQ [15:0] and the strobe signal DQSL/DQSU are bidirectional. The bidirectional signal lines enable the output of an output buffer connected to a bus only when the memory control device 10 and the SDRAM 20 output the respective signals to prevent the signals from interfering with each other. Also, a clock signal, an address signal, and a command signal are connected between the memory control device 10 and the SDRAM 20, but a description thereof will be omitted.

Figure 3:
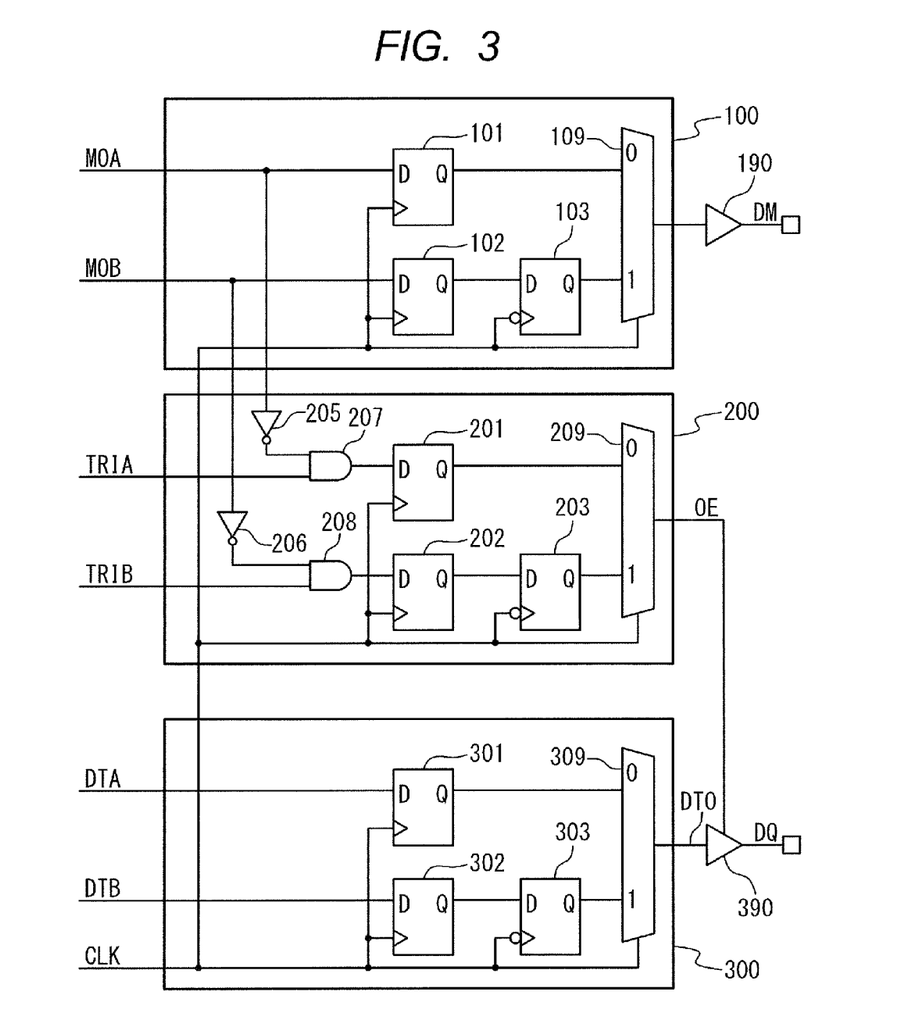
FIG. 3 is a diagram illustrating a configuration of a write data output unit in a memory control device according to a first embodiment.

FIG. 3 is a diagram illustrating a configuration of a write data output unit in the memory control device 10 according to a first embodiment of the present invention. The write data output unit includes a mask signal generation unit 100 that generates and outputs the mask signal DM, a buffer circuit 190 that outputs the mask signal to the SDRAM, a data signal generation unit 300 that generates the data signal DQ, a buffer circuit 390 that outputs the data signal DQ to a bidirectional bus, and an output control signal generation unit 200 that controls the output of the buffer circuit 390. In this example, the write data output unit represents a portion that generates signals related to a set of write data, for example, the data signal DQ [7:0] and the mask signal DML, or the data signal DQ [15:8] and the mask signal DMU. Accordingly, as illustrated in FIG. 2, if a data bus width of the memory control device 10 is 16 bits, the data output units of the same type are arranged in parallel. Also, the data signal generation unit 300 represents a portion that generates the data signal DQ of one signal line of the data signals DQ [7:0] and DQ [15:8]. Accordingly, if data of 8 bits is output in parallel as with the data signals DQ [7:0] and DQ [15:8], the eight data signal generation units 300 are disposed in parallel. One bit of the mask signal DM indicative of whether write is enabled, or not, is added to the data of each eight bits of the data signals DQ [7:0] and DQ [15:8].

The mask signal generation unit 100 includes flip-flops 101, 102, 103, and a selector 109. Mask control signals MOA and MOB to be input represent the respective mask states of data signals DTA and DTB, respectively. The flip-flops 101 and 102 take the mask control signals MOA and MOB in synchronism with a rising edge of a clock signal CLK, respectively. The flip-flop 103 takes an output signal Q102 of the flip-flop 102 in synchronism with a falling edge of the clock signal CLK. Accordingly, an output signal Q103 of the flip-flop 103 is output with a delay of the half cycle of the clock signal CLK. The selector 109, which receives the clock signal CLK as a select control signal, receives an output signal Q101 of the flip-flops 101 and the output signal Q103 of the flip-flop 103, and switchingly outputs signals selected every half cycle of the clock signal CLK. The signal output from the selector 109 is output as the mask signal DM through the buffer circuit 190.

The output control signal generation unit 200 includes flip-flops 201, 202, 203, a selector 209, inverters 205, 206, and AND circuits 207, 208. Output control signals TRIA and TRIB to be input represents whether the data signals DTA and DTB are to be output, or not.

A signal obtained by logically inverting the mask control signal MOA by the inverter 205, and the output control signal TRIA are subjected to AND operation by the AND circuit 207, and taken in the flip-flop 201 in synchronism with the rising edge of the clock signal CLK. That is, the output control signal TRIB is processed so that the buffer circuit 390 outputs no data when the mask control signal MOB indicates that the data signal DTB is masked.

The flip-flop 203 takes an output signal Q202 of the flip-flop 202 in synchronism with the falling edge of the clock signal CLK. Accordingly, an output signal Q203 of the flip-flop 203 is output with a delay of the half cycle of the clock signal CLK. The selector 209, which receives the clock signal CLK as a select control signal, receives an output signal Q201 of the flip-flops 201 and the output signal Q203 of the flip-flop 203, and switchingly outputs signals selected every half cycle of the clock signal CLK. An output control signal OE output from the selector 209 is supplied to an output control node of the buffer circuit 390, and controls whether the buffer circuit 390 outputs an output signal, or is put into a high impedance state.

The data signal generation unit 300 includes flip-flops 301, 302, 303, and a selector 309. Data signals DTA and DTB to be input represent write data. The flip-flops 301 and 302 take the data signals DTA and DTB in synchronism with the rising edge of the clock signal CLK. The flip-flop 303 takes an output signal Q302 of the flip-flop 302 in synchronism with the falling edge of the clock signal CLK. Accordingly, an output Q303 of the flip-flop 303 is output with a delay of the half cycle of the clock signal CLK.

The selector 309, which receives the clock signal CLK as the select control signal, receives an output signal Q301 of the flip-flop 301 and the output signal Q303 of the flip-flop 303, and switchingly outputs signals selected every half cycle of the clock signal CLK. A data signal DTO output from the selector 309 is output through the buffer circuit 390 as the data signal DQ. An output state of the buffer circuit 390 is controlled according to the output control signal OE, and therefore only unmasked data is output from the buffer circuit 390. When there is no write data, that is, when the output control signals TRIA and TRIB indicate disabling, and when the write data is masked, that is, when the mask control signals MOA and MOB indicate enabling, the buffer circuit 390 puts the output node into the high impedance state.

The operation of the write data output unit of the memory control device 10 will be described with reference to FIGS. 4A to 4M and 5A to 5M. Because the write data output unit operates on the basis of the rising and falling of the clock signal CLK, a change in the respective signals will be described on the basis of times ta to tk. The data signals DTA, DTB, the mask control signals MOA, MOB, and the output control signals TRIA, TRIB, which are input to the write data output unit, are signals output from a circuit that operates in synchronism with a clock signal having a phase different from that of the clock signal CLK.

Figure 4:
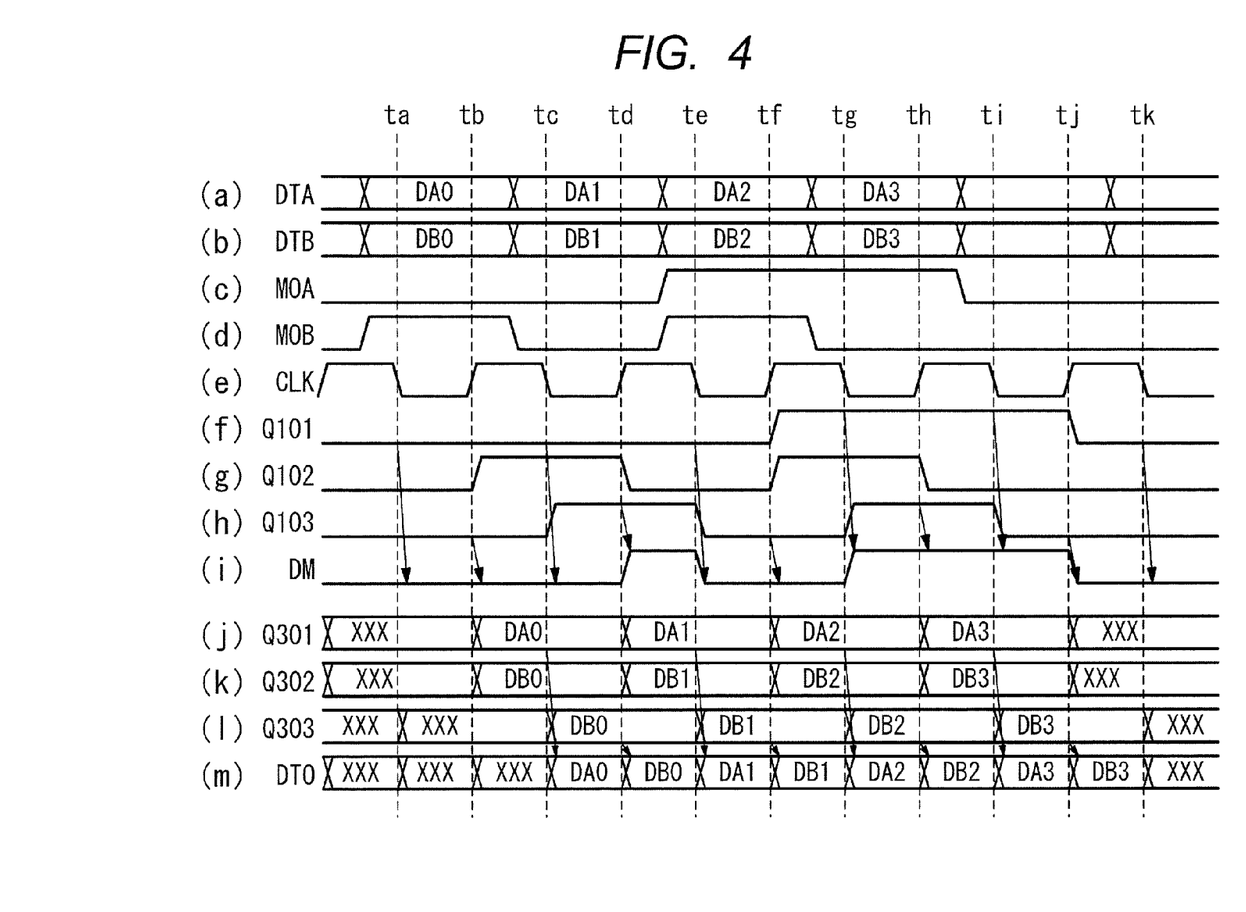
FIGS. 4A to 4M are timing charts illustrating the operation of the write data output unit according to the first embodiment.

As illustrated in FIG. 4A to 4M, at a time ta, the data signals DTA and DTB change as indicated by data DA0 and DB0 (FIGS. 4A and 4B). At a time tb, the data DA0 and DB0 is taken in the flip-flops 301 and 302 in synchronism with a rising of the clock signal CLK (FIG. 4E), and the output signals Q301 and Q302 of the flip-flops 301 and 302 indicate the data DA0 and DB0 (FIGS. 4J and 4K). At a time tb, the mask control signal MOA indicates an L level at which the data DA0 is not masked (FIG. 4C), and the output signal A101 of the flip-flop 101 that takes the mask control signal MOA is maintained at the L level without any change (FIG. 4F). The mask control signal MOB indicates the H level at which the data DB0 is masked (FIG. 4D), and the output signal Q102 of the flip-flop 102 that takes the mask control signal MOB indicates the H level (FIG. 4G).

At a time tc, the flip-flop 103 takes the output signal Q102 of the flip-flop 102, and changes the output signal Q103 to the H level (FIG. 4H). Likewise, the flip-flop 303 takes the output signal Q302 of the flip-flop 302, and changes the output signal Q303 to the data DB0 (FIG. 4L). During a period from the time tc to a time td, the clock signal CLK indicates the L level. The selector 109 outputs the L level indicated by the output signal Q101 output from the flip-flop 101 which is connected to a 0 input node. Accordingly, the buffer circuit 190 output the L level indicative of no masking as the mask signal DM (FIG. 4I). Also, the selector 309 outputs the data DA0 indicated by the output signal Q301 output from the flip-flop 301 connected to the input node 0 as the data signal DTO (FIG. 4M).

At the time td, both of the mask control signals MOA and MOB indicate the L level (FIGS. 4C and 4D), and the flip-flops 101 and 102 set the output signals Q101 and Q102 to the L level (FIGS. 4F and 4G). Also, the data signals DTA and DTB indicate data DA1 and DB2, respectively (FIGS. 4A and 4B), and the flip-flops 301 and 302 set the output signals Q301 and Q302 to data DA1 and DB1, respectively (FIGS. 4J and 4K). During a period from the time td to a time te, the clock signal CLK indicates the H level. The selector 109 outputs the H level indicated by the output signal Q103 output from the flip-flop 103 connected to an input node 1. Accordingly, the buffer circuit 190 outputs a signal of the H level indicative of masking as the mask signal DM (FIG. 4I). Also, the selector 309 outputs the data DB0 indicated by the output signal Q303 output from the flip-flop 303 connected to the input node 1 as the data signal DTO (FIG. 4M).

At the time te, the flip-flop 103 takes the output signal Q102 of the flip-flop 102, and changes the output signal Q103 to the L level (FIG. 4H). The flip-flop 303 takes the output signal Q302 of the flip-flop 302, and changes the output signal Q303 to the data DB1 (FIG. 4L). During a period from the time te to a time tf, the clock signal CLK indicates the L level. The selector 109 outputs the L level indicated by the output signal A101 output from the flip-flop 101 connected to the input node 0. Accordingly, the buffer circuit 190 outputs the L level indicative of no masking as the mask signal DM (FIG. 4I). Also, the selector 309 outputs the data DA1 indicated by the flip-flop 301 connected to the input node 0 as the data signal DTO (FIG. 4M).

Thus, the operation is repeated, during the time tf to a time tg, the data DB1 is output as the data signal DTO (FIG. 4M), and the L level indicative of no masking is output as the mask signal DM (FIG. 4I). During a period from the time tg to a time th, the data DA2 is output as the data signal DTO (FIG. 4M), and the H level indicative of masking is output as the mask signal DM (FIG. 4I). During a period from the time th to a time ti, the data DB2 is output as the data signal DTO (FIG. 4M), and the H level indicative of masking is output as the mask signal DM (FIG. 4I). During a period from the time ti to a time tj, the data DA3 is output to the data signal DTO (FIG. 4M), and the H level indicative of masking is output as the mask signal DM (FIG. 4I). During a period from the time tj to a time tk, the data DA3 is output as the data signal DTO (FIG. 4M), and the H level indicative of masking is output as the mask signal DM (FIG. 4I). During a period from the time tj to a time tk, the data DB3 is output as the data signal DTO (FIG. 4M), and the L level indicative of no masking is output as the mask signal DM (FIG. 4I). At the time tk, the output of the write data is terminated.

The data signals DTA, DTB, the mask control signals MOA, MOB, and the clock signal CLK illustrated in FIGS. 4A to 4E are illustrated in FIGS. 5A, 5B, and 5E to 5G. FIGS. 5C and 5D show the output control signals TRIA and TRIB, and show timing for illustrating the operation of the output control signal generation unit 210. The output control signals TRIA and TRIB indicate the H level so as to put the buffer circuit 390 into an output state in a period where the data DA0 to DA3 and DB0 to DB3 are output.

At the time tb, the flip-flops 201 and 202 take signals obtained by processing the output control signals TRIA and TRIB by the AND circuits 207 and 208 on the basis of the mask control signals MOA and MOB in synchronism with the rising edge of the clock signal CLK, and output the output signals Q201 and Q202. At the time tb, the output control signal TRIA is the H level so as to put the buffer circuit 390 into the output state, and the mask control signal MOA is the L level indicating that the data DA0 is not masked. Therefore, the output signal Q201 of the flip-flop 201 indicates the H level. Also, the output control signal TRIB indicates the H level, and the mask control signal MOB indicates the H level so that the data DB0 is masked. For that reason, the output signal Q202 of the flip-flop 202 is maintained at the L level.

At the time tc, the flip-flop 203 takes the output signal Q202 of the flip-flop 202, and outputs the output signal Q203. However, because the output signal Q202 indicates the L level, the output signal Q203 is maintained at the L level without any change. During a period from the time tc to the time td, because the clock signal CLK indicates the L level, the selector 209 selects the output signal Q201 of the flip-flop 201 connected to the input node 0, and sets the output control signal OE to the H level. The buffer circuit 390 outputs the input data signal DTO as the data signal DQ (data DA0) on the basis of the output control signal OE.

Figure 5:
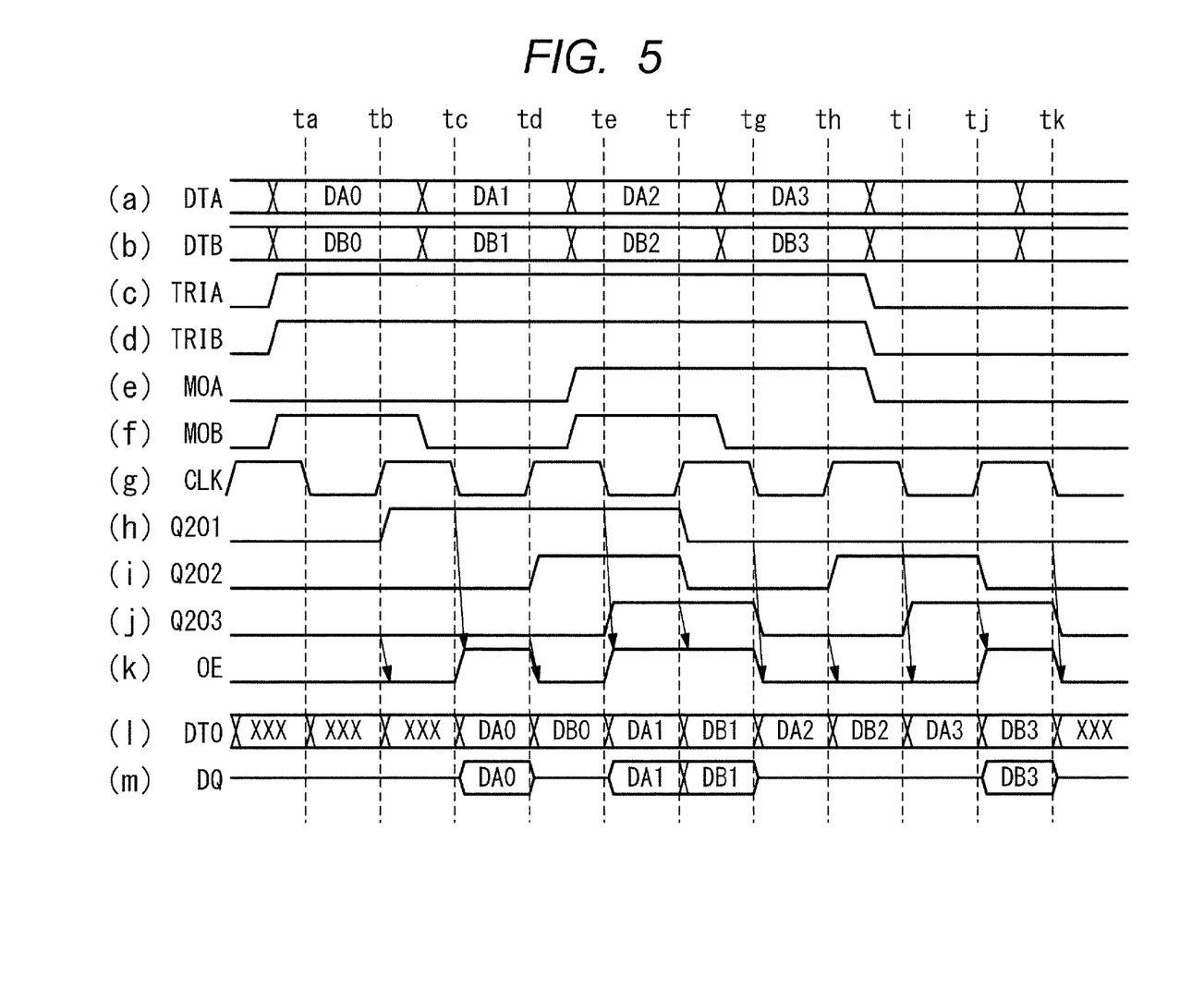
FIGS. 5A to 5M are timing charts illustrating the operation of the write data output unit according to the first embodiment.

At the time td, the flip-flops 201 and 202 take the outputs of the AND circuits 207 and 208, and output the output signals Q201 and Q202. Because both of the mask control signals MOA and MOB indicate no masking, the output signals Q201 and Q202 of the flip-flops 201 and 202 indicate the H level (FIGS. 5H and 5I). During the period from the time td to the time te, because the clock CLK indicates the H level, the selector 209 selects the output signal Q203 of the flip-flop 203 connected to the input node 1, and sets the output control signal OE to the L level (FIG. 5K). The buffer circuit 390 puts the output node into a high impedance state on the basis of the output control signal OE (FIG. 5M).

At the time te, the flip-flop 203 takes the output signal Q202 of the flip-flop 202, and outputs the output signal Q203. In this situation, because the output signal Q202 indicates the H level, the output signal Q203 changes to the H level. During a period from the time te to the time tf, the clock signal CLK indicates the L level. Therefore, the selector 209 selects the output signal Q201 of the flip-flop 201 connected to the input node 0, and puts the output control signal OE to the H level. The buffer circuit 390 outputs the input data signal DTO as the data signal DQ (data DA1) on the basis of the output control signal OE (FIG. 5M).

At the time tf, the flip-flops 201 and 202 take the outputs of the AND circuits 207 and 208, and output the output signals Q201 and Q202. Because both of the mask control signals MOA and MOB indicate masking, the output signals Q201 and Q202 of the flip-flops 201 and 202 change to the L level (FIGS. 5H and 5I). During the period from the time tf to the time tg, because the clock CLK indicates the H level, the selector 209 selects the output signal Q203 of the flip-flop 203 connected to the input node 1, and maintains the output control signal OE at the H level (FIG. 5K). The buffer circuit 390 outputs the input data signal DTO as the data signal DQ (data DB1) on the basis of the output control signal OE (FIG. 5M).

At the time tg, the flip-flop 203 takes the output signal Q202 of the flip-flop 202, and outputs the output signal Q203. In this situation, because the output signal Q202 indicates the L level, the output signal Q203 changes to the L level. During a period from the time tg to the time th, the clock signal CLK indicates the L level. Therefore, the selector 209 selects the output signal Q201 of the flip-flop 201 connected to the input node 0, and puts the output control signal OE to the L level. The buffer circuit 390 puts the output node into the high impedance state on the basis of the output control signal OE (FIG. 5M).

At the time th, the flip-flops 201 and 202 take the outputs of the AND circuits 207 and 208, and output the output signals Q201 and Q202. The mask control signal MOA is set to the H level indicating that the data DA3 is masked, and the mask control signal MOB is set to the L level indicating that the data DA3 is not masked. For that reason, the output signal A201 of the flip-flop 201 is maintained at the L level without any change, and the output signal Q202 of the flip-flop 202 changes to the H level (FIGS. 5H and 5I). During the period from the time th to the time ti, because the clock CLK indicates the H level, the selector 209 selects the output signal Q203 of the flip-flop 203 connected to the input node 1, and maintains the output control signal OE at the L level (FIG. 5K). The buffer circuit 390 puts the output node into the high impedance state on the basis of the output control signal OE (FIG. 5M).

At the time ti, the flip-flop 203 takes the output signal Q202 of the flip-flop 202, and outputs the output signal Q203. In this situation, because the output signal Q202 indicates the H level, the output signal Q203 changes to the H level (FIG. 5J). During a period from the time ti to the time tj, the clock signal CLK indicates the L level. Therefore, the selector 209 selects the output signal Q201 of the flip-flop 201 connected to the input node 0, and puts the output control signal OE to the L level (FIG. 5K). The buffer circuit 390 puts the output node into the high impedance state on the basis of the output control signal OE (FIG. 5M).

At the time tj, the flip-flops 201 and 202 take the outputs of the AND circuits 207 and 208, and output the output signals Q201 and Q202. Since the output data has been supplied, the output control signals TRIA and TRIB indicate the L level, and the output signals Q201 and Q202 of the flip-flops 201 and 202 indicate the L level (FIGS. 5H and 5I). During the period from the time tj to the time tk, because the clock CLK indicates the H level, the selector 209 selects the output signal Q203 of the flip-flop 203 connected to the input node 1, and sets the output control signal OE to the H level (FIG. 5K). The buffer circuit 390 outputs the input data signal DTO as the data signal DQ (data DB3) on the basis of the output control signal OE (FIG. 5M). At the time tk, the output control signal OE generated on the basis of the output control signal TRIA after the period during which the data signals DTA and DTB are input has been terminated is supplied to the buffer circuit 390, and the output node of the buffer circuit 390 is put into the high impedance state till a next data output (FIG. 5M).

Figure 6:
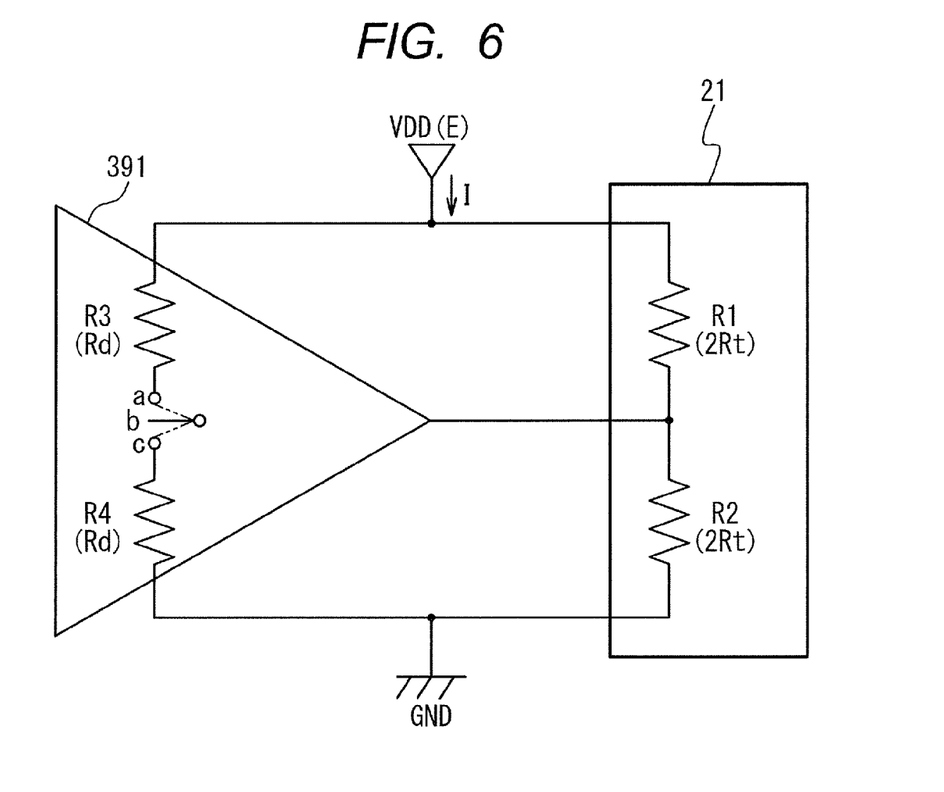
FIG. 6 is a diagram illustrating a relationship between an output resistor of a driver and a termination resistor of a memory circuit.

FIG. 6 is a diagram schematically illustrating a connection of a driver 391 in the buffer circuit 390 and a memory circuit 21 having the termination circuit. The termination circuit of the memory circuit 21 has resistors R1 and R2 each having a resistance value 2×Rt, which are connected in series between a supply voltage VDD and a supply voltage GND. A signal line is connected to a connection node between the resistors R1 and R2. That is, the termination circuit is considered to be terminated by the resistors of the resistance value Rt from the viewpoint of an alternating current. The driver 391 outputs a signal to the signal line through output resistors R3 and R4 each having a resistance value Rd. It is conceivable that the output resistor R3 is connected to the signal line when the signal of the H level is output, and the output resistor R4 is connected to the signal line when the signal of the L level is output. In the following description, it is assumed that the supply voltage VDD is higher than the supply voltage GND by E volts.

In the termination circuit, regardless of the presence or absence of the signal, that is, the voltage level of the signal line, a current flows into the supply voltage GND from the supply voltage VDD through the resistors R1 and R2. For example, when the driver 391 outputs an output of the H level, a switch operates as indicated by symbol "a" in FIG. 6 to close a circuit. In this situation, there is formed a current path along which a current flows into the signal line from the supply voltage VDD through the output resistor R3, and flows from the termination resistor R2 within the memory to the supply voltage GND. That is, the current flows from a driver side to a memory side to increase the power consumption. Also, when the driver 391 outputs the signal of the L level, the switch operates as indicated by symbol "c" in FIG. 6 to close a circuit. In this situation, there is formed a current path along which a current flows into the signal line from the supply voltage VDD through the resistor R1, and further flows to the supply voltage GND through the output resistor R4 of the driver 391. That is, the current flows from the memory side to the driver side to increase the power consumption. When the memory control device 10 is kept in an input state, and the driver 391 outputs no data, the switch operates as indicated by symbol "c" in FIG. 6 to close a circuit. That is, the driver 391 becomes in a high impedance state. In this situation, there is formed no current path along which a current flows through the output resistors R3 and R4 of the driver 391.

A difference between the current having the current channel flowing in the output resistors R3 and R4 through the signal line, and the current having only th current path of the termination resistors R1 and R2 is expressed by E×Rt/(4×Rt×(Rd+Rt))=E/(4×(Rd+Rt)). Accordingly, when the driver 391 is in a disable state (high impedance state), an current I flowing in a power supply system is reduced by E/(4×(Rd+Rt)) as compared with a case where the driver 391 is in an enable state (signal output state). It is found that as a period during which the driver 391 is high in the impedance is longer, that is, as the use frequency of the data mask is higher, a power saving effect is higher.

Figure 7:
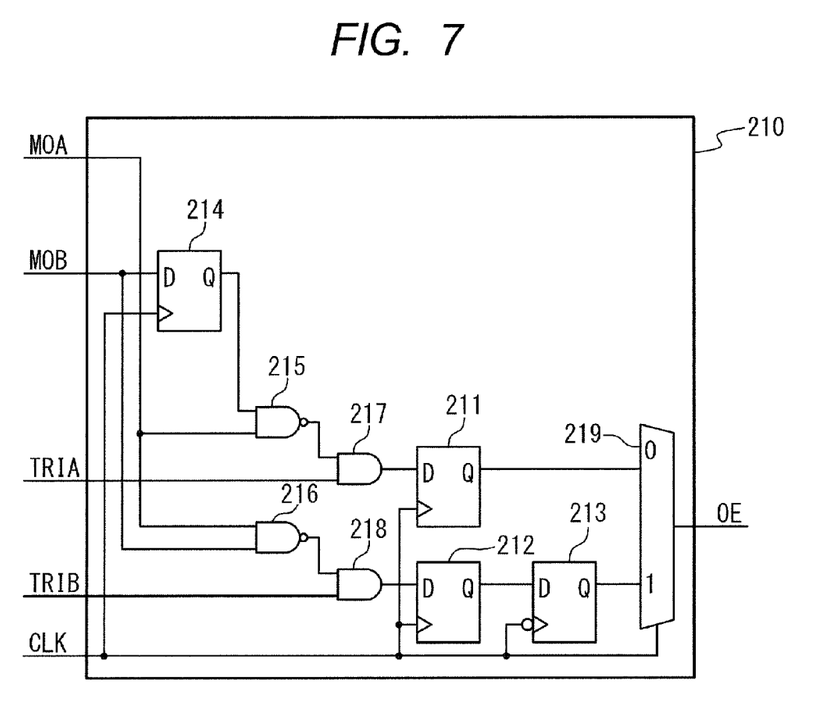
FIG. 7 is a diagram illustrating a configuration of an output control signal generation unit according to a second embodiment.

FIG. 7 is a diagram illustrating a configuration of an output control signal generation unit 210 according to a second embodiment of the present invention. The output control signal generation unit 200 according to the first embodiment sets a buffer circuit output during a period corresponding to the mask signal DM to a high impedance. The output control signal generation unit 210 according to the second embodiment reduces the period during which the output is set to the high impedance in correspondence with the mask signal DM, and extends the period of the data output state.

The output control signal generation unit 210 includes flip-flops 211, 212, 213, 214, a selector 219, NAND circuits 215, 216, and AND circuits 217, 218. The input output control signals TRIA, TRIB, and the mask control signals MOA, MOB are identical in conditions with those in the output control signal generation unit 200 according to the first embodiment. The flip-flop 214 takes the mask control signal MOB in synchronism with the rising edge of the clock signal CLK, and holds a mask state of the data output before half clock of the data output from the data signal DTA. The NAND circuit 215 receives an output signal Q214 of the flip-flop 214, and the mask control signal MOA, generates a signal that gates the output control signal TRIA, and supplies the generated signal to the AND circuit 217. The NAND circuit 216 receives the mask control signals MOA and MOB, generates a signal that gates the output control signal TRIB, and supplies the generated signal to the NAND circuit 218.

The flip-flop 211 takes the output control signal TRIA processed by the AND circuit 217 in synchronism with a rising of the clock signal CLK, and outputs an output signal Q211 to the selector 219. The flip-flop 212 takes an output of the NAND circuit 218 that gates the output control signal TRIB in synchronism with the rising of the clock signal CLK, and outputs an output signal Q212 to the flip-flop 213. The flip-flop 213 takes the signal Q212 in synchronism with a falling of the clock signal CLK, and outputs an output signal Q213 to the selector 219. The selector 219, which receives the clock signal CLK as a selection control signal, receives the output signal Q211 of the flip-flop 211 and the output signal Q213 of the flip-flop 213, and switchingly outputs a signal selected every half cycle of the clock signal CLK. The output control signal OE output from the selector 219 is supplied to an output control node of the buffer circuit 390, and controls whether the buffer circuit 390 outputs an output signal, or becomes in the high impedance state.

Figure 8:
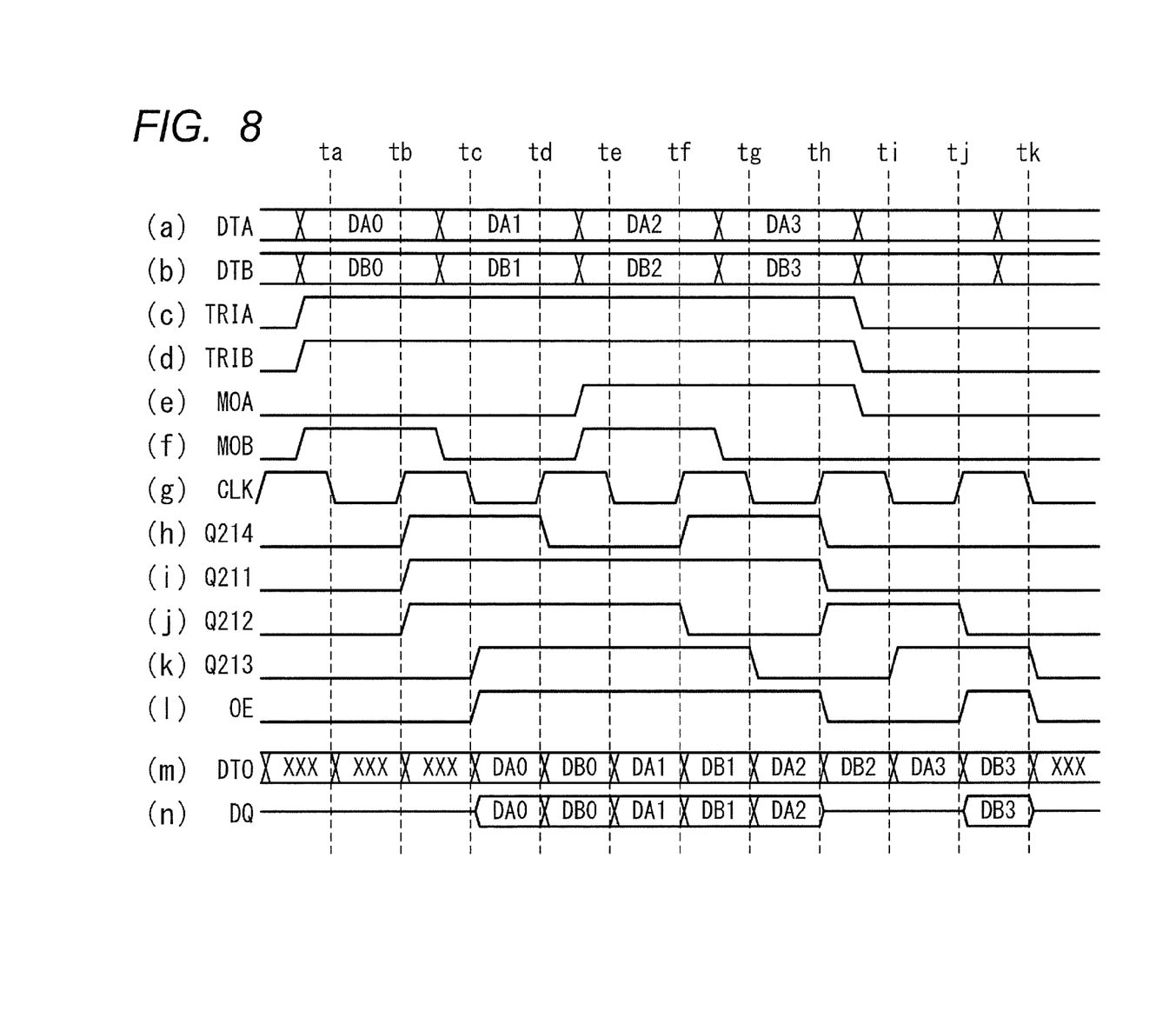

The operation of the output control signal generation unit 210 will be described with reference to FIGS. 8A to 8N. As illustrated in FIGS. 8A to 8G, the data signals DTA, DTB, the output control signals TRIA, TRIB, the mask control signals MOA, MOB, and the clock signal CLK are input to the output control signal generation unit 210 at the same timing as the timing illustrated in FIGS. 5A to 5G. Unlike the output control signal generation unit 200, the output control signal generation unit 210 includes the NAND circuits 215 and 216 that receive the values of the mask control signals MOA and MOB with respect to the data output previously from the buffer circuit 390.

The flip-flop 214 takes the mask control signal MOB in synchronism with the rising of the clock signal CLK, and supplies an output signal Q214 to the NAND circuit 215. That is, the flip-flop 214 operates to reflect a state of the mask control signal MOB in one previous clock of the clock signal CLK on processing of the output control signal TRIA. When the mask control signal MOA is indicative of masking, unless the mask control signal MOB in the one previous clock, that is, the output signal Q214 of the flip-flop 214 is indicative of masking (L level), the output of the NAND circuit 215 becomes H level. Accordingly, the AND circuit 217 outputs the H level indicated by the output control signal TRIA, and continues the data output.

In FIGS. 8A to 8N, when the data signal DTB taken at the time td is indicative of the data DB1 (FIG. 8B), the mask control signal MOB is L level indicative of the output of the data DB1 (FIG. 8F). The data DA2 subsequently output is taken at the time tf (FIG. 8A), and the mask control signal MOA at that time is H level indicating that the data DA2 is masked (FIG. 8E). In the output control signal generation unit 200 described in the first embodiment, because the data DA2 is masked, the output control signal OE becomes L level, and the buffer circuit 390 is set to the high impedance. In this example, the output control signal OE is indicative of the H level under the control of the AND circuit 217 (tg to th in FIG. 8L), and the buffer circuit 390 outputs the data DA2 (FIG. 8N).

Also, in the processing on the data signal DTB side, the mask state on the data signal DTA side output previously can be known by the state of the mask control signal MOA at the time of output. When the mask control signal MOB is indicative of the mask state, and the mask control signal MOA is not indicative of the mask state, the output of the data signal DTB is output without being masked. The mask control signals MOA and MOB are added by the NAND circuit 216, and when both of the data on the data signal DTA side and the data on the subsequent data signal DTB side are masked, the buffer circuit 390 can be put into the high impedance state.

In FIGS. 8A to 8N, the mask control signal MOB is H level indicative of the mask state for the data DB0 taken at the time t (FIGS. 8B and 8D). In this situation, the mask control signal MOA for the data DA0 is L level indicative of no masking (FIGS. 8A and 8E). Accordingly, when the data DB0 is output (times td to te), the output control signal OE is indicative of the H level, and the buffer circuit 390 outputs the data DB0 (FIG. 8N). Also, both of the data DA2 and DB2 taken at the time tf (FIGS. 8A and 8B) are masked as indicated by the mask control signals MOA and MOB (FIGS. 8E and 8F). Accordingly, when the data DB2 is output (times th to ti), the output control signal OE becomes L level (FIG. 8L), the buffer circuit 390 is put into the high impedance state, and the data DB is not output (FIG. 8N).

Thus, the output control signal generation unit 210 generates the output control signal OE for controlling a period of data subsequent to the unmasked data not to be also put into the high impedance state, and extends the period of the data output. A bus immediately after the period of the unmasked data output can be stabilized. In this example, the period of the data output is extended by half cycle of the clock signal CLK. Alternatively, the extension period can be set to a quarter cycle, or one cycle of the clock signal CLK. Also, a selector circuit may be so provided as to select an extension time from a plurality of extension periods, so that a time during which the output node is put into the high impedance state can be reduced.

Figure 9:
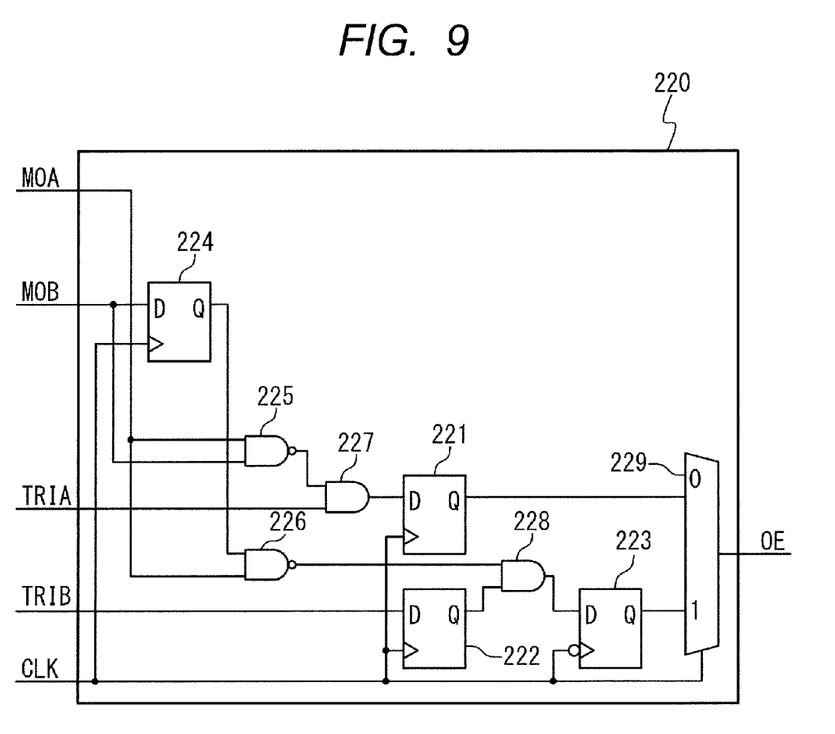
FIG. 9 is a diagram illustrating a configuration of an output control signal generation unit according to a third embodiment.

FIG. 9 is a diagram illustrating a configuration of an output control signal generation unit 220 according to a third embodiment of the present invention. The output control signal generation unit 220 according to the third embodiment extends the period during which the output node is not put into the high impedance state in correspondence with the mask signal DM in advance, and reduces the period during which the output node is put into the high impedance state.

The output control signal generation unit 220 includes flip-flops 221, 222, 223, 224, a selector 229, NAND circuits 225, 226, and AND circuits 227, 228. The input output control signals TRIA, TRIB, and the mask control signals MOA, MOB are identical in conditions with those in the output control signal generation unit 200 according to the first embodiment.

The flip-flop 224 takes the mask control signal MOB in synchronism with the rising edge of the clock signal CLK, and holds the mask state of the data output before the half clock of the data output from the data signal DTA. The NAND circuit 225 receives the mask control signals MOA and MOB, generates a signal that gates the output control signal TRIA, and supplies the generated signal to the AND circuit 227. The NAND circuit 226 receives the output signal Q224 of the flip-flop 224 and the mask control signal MOA, generates a signal that gates the output signal Q222 of the flip-flop 222, and supplies the generated signal to the AND circuit 228.

The flip-flop 221 takes an output of the AND circuit 227 that gates the output control signal TRIA in synchronism with the rising of the clock signal CLK, and outputs an output signal Q221 to the selector 229. The flip-flop 222 takes the output control signal TRIB in synchronism with the rising of the clock signal CLK, and outputs an output signal Q222 to the AND circuit 228. The AND circuit 228 receives an output of the NAND circuit 226 and an output signal Q222 of the flip-flop 222, and outputs AND thereof to the flip-flop 223. The flip-flop 223 takes a signal output from the AND circuit 228 in synchronism with the falling of the clock signal CLK, and outputs an output signal Q223 to the selector 229.

The selector 229, which receives the clock signal CLK as the selection control signal, receives the output signal Q221 of the flip-flop 221 and the output signal Q223 of the flip-flop 223, and switchingly outputs a signal selected every half cycle of the clock signal CLK. The output control signal OE output from the selector 229 is supplied to an output control node of the buffer circuit 390, and controls whether the buffer circuit 390 outputs an output signal, or becomes in the high impedance state.

Figure 10:
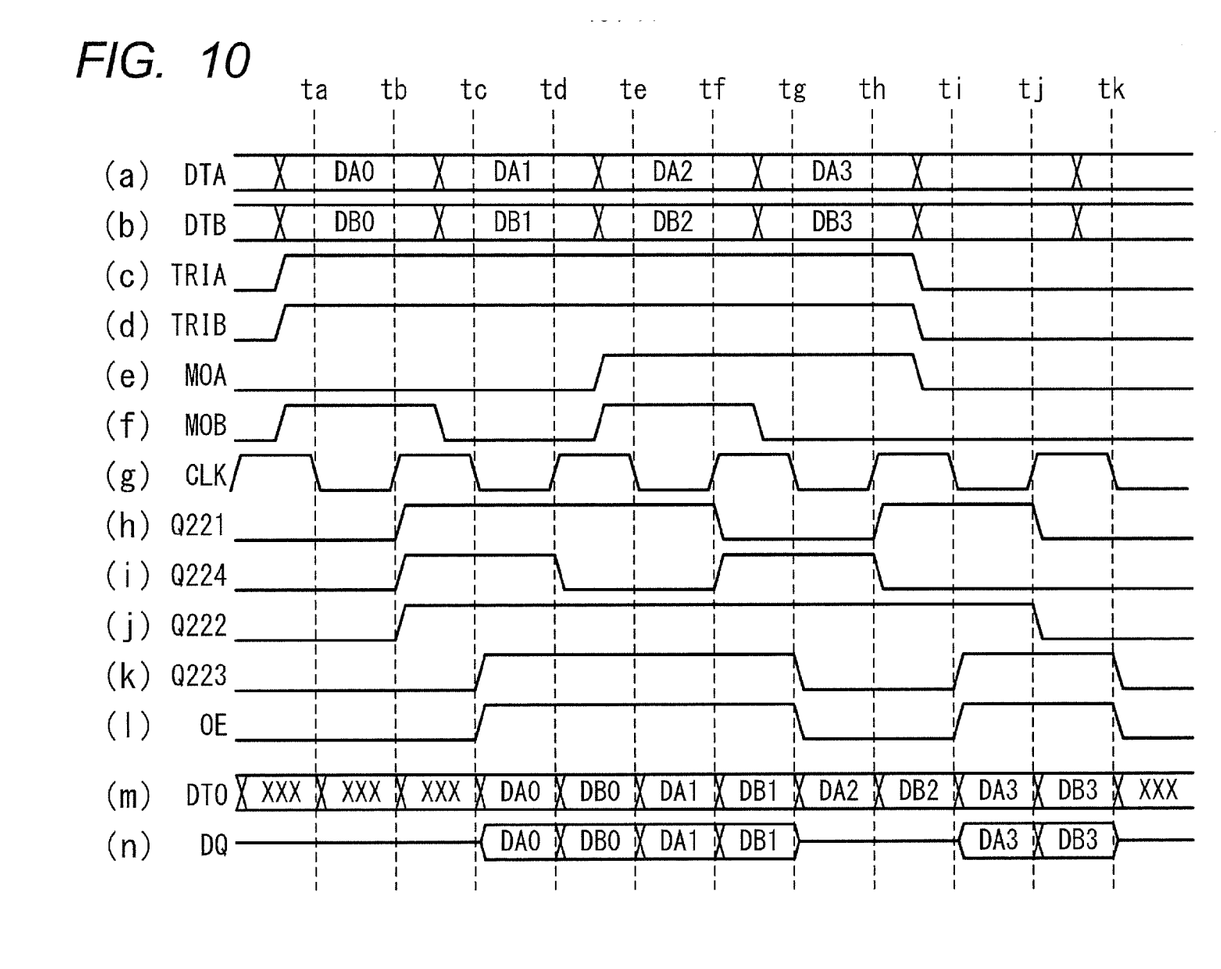

The operation of the output control signal generation unit 220 will be described with reference to FIGS. 10A to 10N. As illustrated in FIGS. 10A to 10G, the output control signals TRIA, TRIB, the mask control signals MOA, MOB, and the clock signal CLK are input to the output control signal generation unit 210 at the same timing as the timing illustrated in FIGS. 5A to 5G. The output control signal generation unit 220 includes NAND circuits 225 and 226 that receive values of the mask control signals MOA and MOB for the data output subsequently from the buffer circuit 390.

The flip-flop 221 takes the H level and outputs an output signal Q221 in synchronism with the rising of the clock signal CLK when at least one of the mask control signals MOA and MOB is L level indicative of no masking during a period where the output control signal TRIA is indicative of the H level (FIG. 10H). Accordingly, when data on the data signal DTB side is output, the buffer circuit 390 is put into an output state during a data output period on a preceding data signal DTA side. That is, data on the DTA side is output even when the data output on the data signal DTA side is masked.

The flip-flop 224 takes the mask control signal MOB in synchronism with the rising of the clock signal CLK, and supplies an output signal Q224 to the NAND circuit 226 (FIG. 10I). Accordingly, the output signal Q224 of the flip-flop 224 is so delayed as to change the mask control signal MOB in synchronism with the rising of the clock signal CLK. The flip-flop 222 takes the output control signal TRIB in synchronism with the rising of the clock signal CLK, and outputs an output signal Q222 (FIG. 10J). The output signal Q222 is gated by the AND circuit 228 so as to be enabled when at least one of the output signal Q224 of the flip-flop 224 and the mask control signal MOA is indicative of the L level, and then supplied to the flip-flop 223.

The flip-flop 223 takes the output signal of the AND circuit 228 in synchronism with the rising of the clock signal CLK, and outputs an output signal Q223 (FIG. 10K). The selector 229 selects the output signal Q221 of the flip-flop 221 when the clock signal CLK is L level, and selects the output signal of the flip-flop 223 when the clock signal CLK is H level to output the selected output signal as the output control signal OE (FIG. 10L). Accordingly, output periods of the data DB0 and DA3 among the data masked by the mask control signals MOA and MOB have periods during which the data is subsequently output. Therefore, the buffer circuit 390 is not put into the high impedance state, but the data DB0 and DA3 are output. The data DB0 and DA3 are data to be originally masked, and therefore may be dummy data.

Thus, the output control signal generation unit 220 generates the output control signal OE for controlling data before unmasked data not to be also put into the high impedance state, and can extend the period of the data output. A data bus immediately before the period of the unmasked data output can be stabilized. Also, the extension period can be also changed as in the second embodiment.

As in the first embodiment, the higher impedance (output is disabled) of the output node of the buffer circuit 390 is controlled during the burst transfer on the basis of the mask control signals MOA and MOB. As a result, a waveform of the data signal is disturbed at the SDRAM 20 end depending on the usage environments, resulting in a possibility that a necessary setup time and hold time are difficult to hold. In this case, modification is conducted as with the output control signal generation units 210 and 220 of the second and third embodiments, a timing of putting the output node of the buffer circuit 390 into the high impedance state (disabling the output) may be delayed, a timing of canceling the high impedance state (enabling the output) may be fastened, or both thereof may be applied.

In the above embodiment, because the clock signal CLK is used as the clock signal for generating the timing, the respective timings are based on the half cycle of the clock signal CLK. However, in the interior of the memory control device, because a clock signal shorter in the cycle (higher in frequency) is also used, for example, a timing based on ¼ cycles of the clock signal CLK can be generated. Also, if there is no inconsistency in the standards of the bus, a leading data output period and a tailing data output period can be extended. In the above description, data is supplied from the two data signals DTA and DTB to generate the data output signal. Alternatively, one data output signal may be generated from more data signals.

Figure 11:
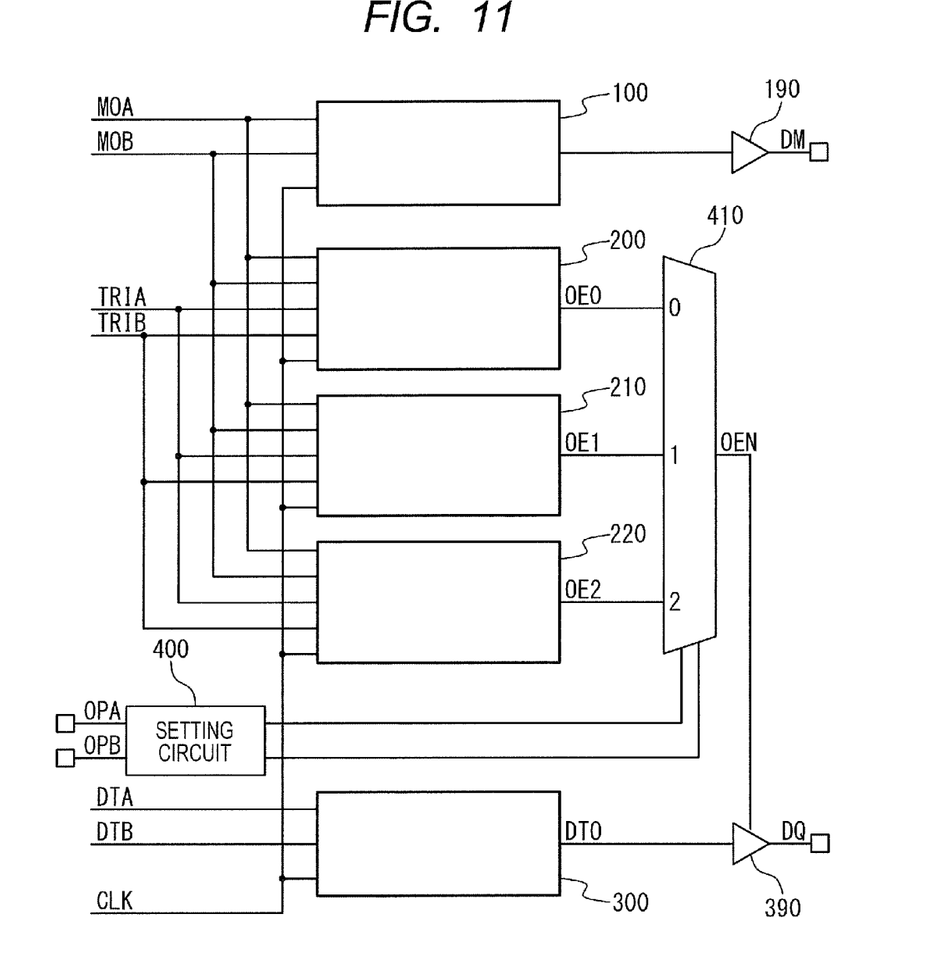
FIG. 11 is a diagram illustrating a configuration of a write data output unit in a memory control device according to a fourth embodiment.

FIG. 11 is a diagram illustrating a configuration of a write data output unit in the memory control device 10 according to a fourth embodiment of the present invention. The write data output unit includes the mask signal generation unit 100 that generates and outputs the mask signal DM, the buffer circuit 190 that outputs the mask signal to the SDRAM, the data signal generation unit 300 that generates the data signal DQ, the buffer circuit 390 that outputs the data signal DQ to a bidirectional bus, the output control signal generation units 200, 210, 220 that control an output of the buffer 390, a selector 410, and a setting circuit 400.

The mask signal generation unit 100, the buffer circuit 190, the data signal generation unit 300, and the buffer circuit 390 are identical with those described in the first embodiment. The output control signal generation units 200, 210, and 220 are identical with those described in the first, second, and third embodiments, respectively, and output output control signals OE0, OE1, and OE2, respectively. The setting circuit 400 generates a signal for controlling the selector 410, on the basis of input setting signals OPA and OPB. The selector 410 selects any one of the output control signals OE0, OE1, and OE2 output from the output control signal generation units 200, 210, and 220, respectively, and outputs an output control signal OEN. The buffer circuit 390 puts the output node into the high impedance state according to the output control signal OEN output from the selector 410 on the basis of the input setting signals OPA and OPB. As a result, a high impedance period can be selected according to a status of the memory system. In this example, for simplification of description, the output control signal generation units 200, 210, and 220 are separated from each other, but may be communalized to simplify the circuit.

The setting signals OPA and OPB may be supplied from a register that holds setting information which is disposed within the memory control device 10. The register that holds the setting information may be disposed within the setting circuit 400. With the provision of the register that holds the setting information, the setting values of the setting signals OPA and OPB can be set together with other parameters of the memory control device 10 during initialization. If a device that controls the memory control device 10 is disposed outside, when the memory control device 10 starts the operation, the setting values can be set in the register. If a nonvolatile memory that stores a variety of setting values is provided, the setting values of the setting signals OPA and OPB set in the nonvolatile memory can be set in the register. Also, the memory control device 10 includes a terminal that takes the setting signals OPA and OPB from the external.

Figure 1:
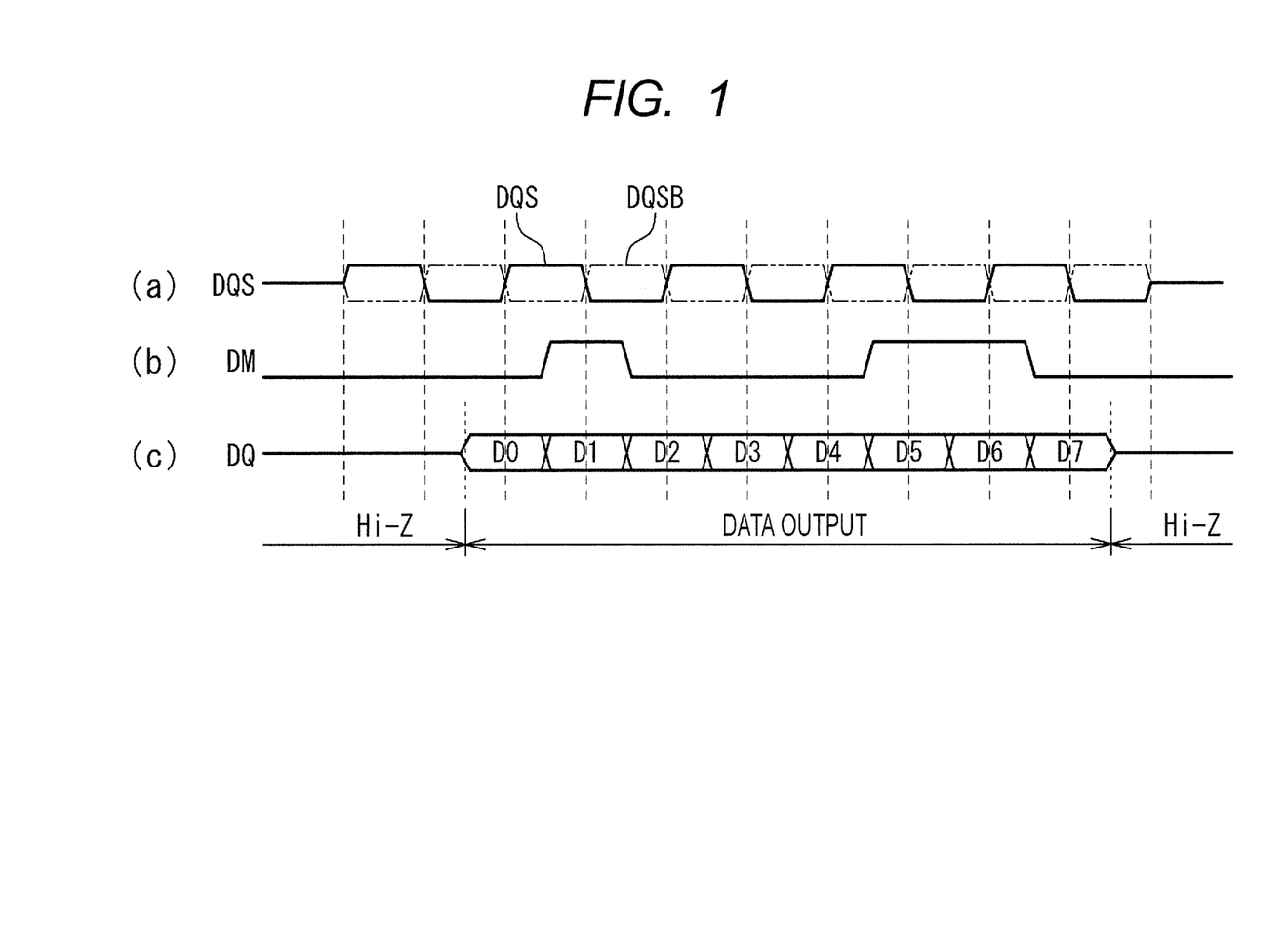
FIGS. 1A to 1C are diagrams illustrating timing in which write data is burst-transferred to an SDRAM.

In this example, a description will be given of the memory control device 10 having the output control signal generation units 200, 210, and 220 that put the buffer circuit 390 into the high impedance state on the basis of the mask signal during the burst transfer. Alternatively, as illustrated in FIG. 1, there may be provided an output control signal generation unit that does not put the buffer circuit 390 into the high impedance state during the burst transfer. Whether the buffer circuit 390 is put into the high impedance state, or not, can be switched on the basis of the mask signal during the burst transfer. In a system having a plurality of operation speed modes, switching can be so conducted as to prioritize a signal waveform quality during high speed operation and a power consumption reduction during low speed operation. Also, the above switching function is also effective even when a function of putting into the high impedance state is disabled during the burst transfer when conducting a shipping test.

The present invention has been described above with reference to the embodiments. The above embodiments can be implemented in combination if there is no inconsistency. Also, the present invention is not limited to the above embodiments, but the configuration and details of the present invention can be variously changed for facilitation of understanding by an ordinary skilled person within the scope of the present invention.

What is claimed is:

1. A memory control device, comprising:
   a data output buffer circuit that burst-transfers data to a memory device through a data bus; and
   a mask signal output buffer circuit that outputs, to the memory device, a mask signal indicative of data that prohibits write into a memory cell within the memory device among the data,
   wherein the data output buffer circuit puts an output node into a high impedance state when the mask signal is indicative of write prohibition.

2. The memory control device according to claim 1,
   wherein when the mask signal is switched from a state in which the mask signal is not indicative of the write prohibition to a state in which the mask signal is indicative of the write prohibition, the data output buffer circuit delays a timing at which the output node is put into a high impedance state, and extends a period during which the data is output.

3. The memory control device according to claim 1,
   wherein when the mask signal is switched from a state in which th mask signal is indicative of the write prohibition to a state in which the mask signal is not indicative of the write prohibition, the data output buffer circuit fastens a timing at which the data is output from the output node, and extends a period during which the data is output.

4. The memory control device according to claim 1, further comprising:
   an output control signal output node that generates an output control signal for controlling a high impedance state of the output node; and
   a setting unit that sets whether the output control signal puts the output node into a high impedance state during the burst transfer, or not.

5. A memory control device, comprising:
a data signal generator circuit that generates data to be burst-transferred to a memory device;
a buffer circuit that burst-transfers the data to the memory device through a data bus;
a mask signal generator circuit that generates a mask signal indicative of whether the data on the data bus is written into a memory cell within the memory device, or not, on the basis of a mask control signal indicative of whether data write is enabled, or not; and
an output control signal generation unit that generates an output control signal for putting an output node of the buffer circuit into a high impedance state when there is no data to be output to the data bus, on the basis of a data control signal indicative of whether there is the data, or not,
wherein the output control signal generation unit changes the output control signal during a period in which the data is burst-transferred to put the output node into the high impedance state, on the basis of the mask control signal.

6. The memory control device according to claim 5,
wherein the output control signal generation unit changes the output control signal so as to put the output node into a high impedance state during a period in which the mask signal is indicative of masking.

7. The memory control device according to claim 6,
wherein the output control signal generation unit changes the output control signal so as to delay a timing at which the output node is put into a high impedance state when changing from a state in which the mask signal is indicative of no masking to a state in which the mask signal is indicative of masking.

8. The memory control device according to claim 6,
wherein the output control signal generation unit changes the output control signal so as to output the data with a reduction of a period during which the output node is put into a high impedance state when changing from a state in which the mask signal is indicative of masking to a state in which the mask signal is indicative of no masking.

9. The memory control device according to claim 5, further comprising:
a setting circuit that sets whether the output node is put into the high impedance state, or not, on the basis of the mask signal.

10. The memory control device according to claim 9, further comprising:
an input terminal that receives a changeover setting signal for changing a setting state of the setting circuit.

11. The memory control device according to claim 9, further comprising:
a register that holds the setting state of the setting circuit.

12. The memory control device according to claim 11, further comprising:
a rewritable nonvolatile memory that holds information to be set in the register.

13. A semiconductor integrated circuit device, comprising:
the memory control device according to claim 1.

14. A memory system, comprising:
the semiconductor integrated circuit device according to claim 13; and
a memory device having a termination circuit that terminates the data bus for transferring data output from the semiconductor integrated circuit device.

15. A memory write data transfer method, comprising the steps of:
burst-transferring data to a memory device through a data bus;
outputting, to the memory device, a mask signal indicative of data that prohibits write into a memory cell within the memory device among the data; and
putting an output node that outputs the data into a high impedance state when the mask signal is indicative of write prohibition.

* * * * *